US011062773B2

(12) United States Patent
Lin et al.

(10) Patent No.: US 11,062,773 B2
(45) Date of Patent: Jul. 13, 2021

(54) NEAR-MEMORY COMPUTATION SYSTEM FOR ANALOG COMPUTING

(71) Applicant: eMemory Technology Inc., Hsin-Chu (TW)

(72) Inventors: Chun-Fu Lin, Hsinchu County (TW); Ching-Yuan Lin, Hsinchu County (TW); Tsung-Mu Lai, Hsinchu County (TW); Chih-Hsin Chen, Hsinchu County (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 16/826,278

(22) Filed: Mar. 22, 2020

(65) Prior Publication Data

US 2020/0365209 A1 Nov. 19, 2020

Related U.S. Application Data

(60) Provisional application No. 62/847,246, filed on May 13, 2019.

(51) Int. Cl.
*G11C 16/04* (2006.01)
*G06N 3/02* (2006.01)
(Continued)

(52) U.S. Cl.
CPC ........... *G11C 16/0408* (2013.01); *G06N 3/02* (2013.01); *G11C 16/10* (2013.01); *G11C 16/26* (2013.01); *G11C 16/14* (2013.01)

(58) Field of Classification Search
CPC ..... G11C 16/0408; G11C 16/10; G11C 16/26; G11C 16/14; G06N 3/02
(Continued)

(56) References Cited

U.S. PATENT DOCUMENTS

| 6,864,165 B1 * | 3/2005 | Pogge ............... H01L 21/6835 228/179.1 |
| 2016/0070840 A1 * | 3/2016 | Barowski ............ G06F 30/394 716/126 |
| 2020/0202941 A1 * | 6/2020 | Lai ......................... G11C 16/14 |

FOREIGN PATENT DOCUMENTS

WO    2005/024718 A1    3/2005

OTHER PUBLICATIONS

Kota Ando et al., BRein Memory: A Single-Chip Binary/Ternary Reconfigurable in-Memory Deep Neural Network Accelerator Achieving 1.4 TOPS at 0.6 W, IEEE Journal of Solid-State Circuits, vol. 53, No. 4, Apr. 2018, pp. 983-994, XP011679935.

(Continued)

*Primary Examiner* — Huan Hoang
(74) *Attorney, Agent, or Firm* — Winston Hsu (57) ABSTRACT

A near-memory computation system includes a plurality of computation nodes. Each computation node receives a plurality of input signals and outputs a computing result signal. The computation node includes a plurality of non-volatile memory cells and a processing element. Each non-volatile memory cell stores a weighting value during a program operation and outputs a weighting signal according to the weighting value during a read operation. The processing element is coupled to the plurality of non-volatile memory cells. The processing element receives the plurality of input signals and generates the computing result signal by performing computations with the plurality of input signals and a plurality of weighting signals generated by the plurality of non-volatile memory cells. The plurality of non-volatile memory cells and the processing element are manufactured by different or the same processes.

18 Claims, 4 Drawing Sheets

(51) Int. Cl.
 *G11C 16/10* (2006.01)
 *G11C 16/26* (2006.01)
 *G11C 16/14* (2006.01)

(58) Field of Classification Search
 USPC .................................................. 365/185.18
 See application file for complete search history.

(56) References Cited

OTHER PUBLICATIONS

Ali Shafiee et al., ISAAC: A Convolutional Neural Network Accelerator with In-Situ Analog Arithmetic in Crossbars, 2016 ACM/IEEE 43rd Annual International Symposium on Computer Architecture, pp. 14-26, XP032950645, 2016.

Duckhwan Kim et al., Neurocube: A Programmable Digital Neuromorphic Architecture with High-Density 3D Memory, 2016 ACM/IEEE 43rd Annual International Symposium on Computer Architecture, pp. 380-392, XP032950674, 2016.

Kim, "A 68 Parallel Row Access Neuromorphic Core with 22K Multi-Level Synapses Based on Logic-Compatible Embedded Flash Memory Technology", 2018 IEEE International Electron Devices Meeting (IEDM), Dec. 1, 2018.

Kodai Ueyoshi et al., "Quest: A 7.49TOPS Multi-Purpose Log-Quantized DNN Inference Engine Stacked on 96MB 3D SRAM Using Inductive-Coupling Technology in 40nm CMOS", ISSCC 2018/ Session 13/ Machine Learning and Signal Processing/ 13.2, pp. 216-218, Feb. 13, 2018.

Daniel Bankman et al., "An Always-On 3.8 µJ/86% CIFAR-10 Mixed-Signal Binary CNN Processor With All Memory on Chip in 28-nm CMOS", IEEE Journal of Solid-State Circuits, vol. 54, No. 1, Jan. 2019, pp. 158-172, Jan. 2019.

\* cited by examiner

NEAR-MEMORY COMPUTATION SYSTEM FOR ANALOG COMPUTING

CROSS REFERENCE TO RELATED APPLICATIONS

This non-provisional application claims priority of U.S. provisional application No. 62/847,246, filed on May 13, 2019 included herein by reference in its entirety.

BACKGROUND OF THE INVENTION

1. Field of the Invention

The present invention is related to a near-memory computation system, and more particularly, to a near-memory computation system for analog computing.

2. Description of the Prior Art

As artificial intelligence (AI) is applied to more and more fields, the demand for suitable computation hardware grows due to the bulk computations required by the algorithms of artificial intelligence. Generally, the AI system has to deal with lots of data in a short time to make predictions or judgments accurately, and the data computations are usually performed in parallel.

The neural network is one of the popular schemes for AI systems. The neural network includes lots of nodes. Each node receives data from many other nodes to perform computations, and the computation result will be used by other nodes. Since the amount of data required for AI computation is very huge, the data is usually stored in the external memory, and will be retrieved to the internal memory by request. Therefore, the bandwidth for accessing data will affect the processing speed of the AI system, and the power consumption for accessing data also becomes a burden to the AI system.

SUMMARY OF THE INVENTION

One embodiment of the present invention discloses a near-memory computation system. The near-memory computation system includes a plurality of computation nodes.

Each of the computation nodes receives a plurality of input signals and outputs a computing result signal. Each of the computation nodes includes a plurality of non-volatile memory cells and a processing element. The processing element is coupled to the plurality of non-volatile memory cells.

Each non-volatile memory cell stores a weighting value during a program operation and outputs a weighting signal according to the weighting value during a read operation. The processing element receives the plurality of input signals and generates the computing result signal by performing computations with the plurality of input signals and a plurality of weighting signals generated by the plurality of non-volatile memory cells. The plurality of non-volatile memory cells and the processing element are disposed in two different chips, and the processing element is directly coupled to the plurality of non-volatile memory cells by face-to-face bonding or through silicon vias (TSV) between the two different chips.

Another embodiment of the present invention discloses a near-memory computation system. The near-memory computation system includes a plurality of computation nodes.

Each of the computation nodes receives a plurality of input signals and outputs a computing result signal. Each of the computation nodes includes a plurality of non-volatile memory cells and a processing element. The processing element is coupled to the plurality of non-volatile memory cells.

Each non-volatile memory cell stores a weighting value during a program operation and outputs a weighting signal according to the weighting value during a read operation. The processing element receives the plurality of input signals and generates the computing result signal by performing computations with the plurality of input signals and a plurality of weighting signals generated by the plurality of non-volatile memory cells. The near-memory computation system is formed in a system-on-a-chip, and the processing element is directly coupled to the plurality of non-volatile memory cells with on-chip interconnection.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
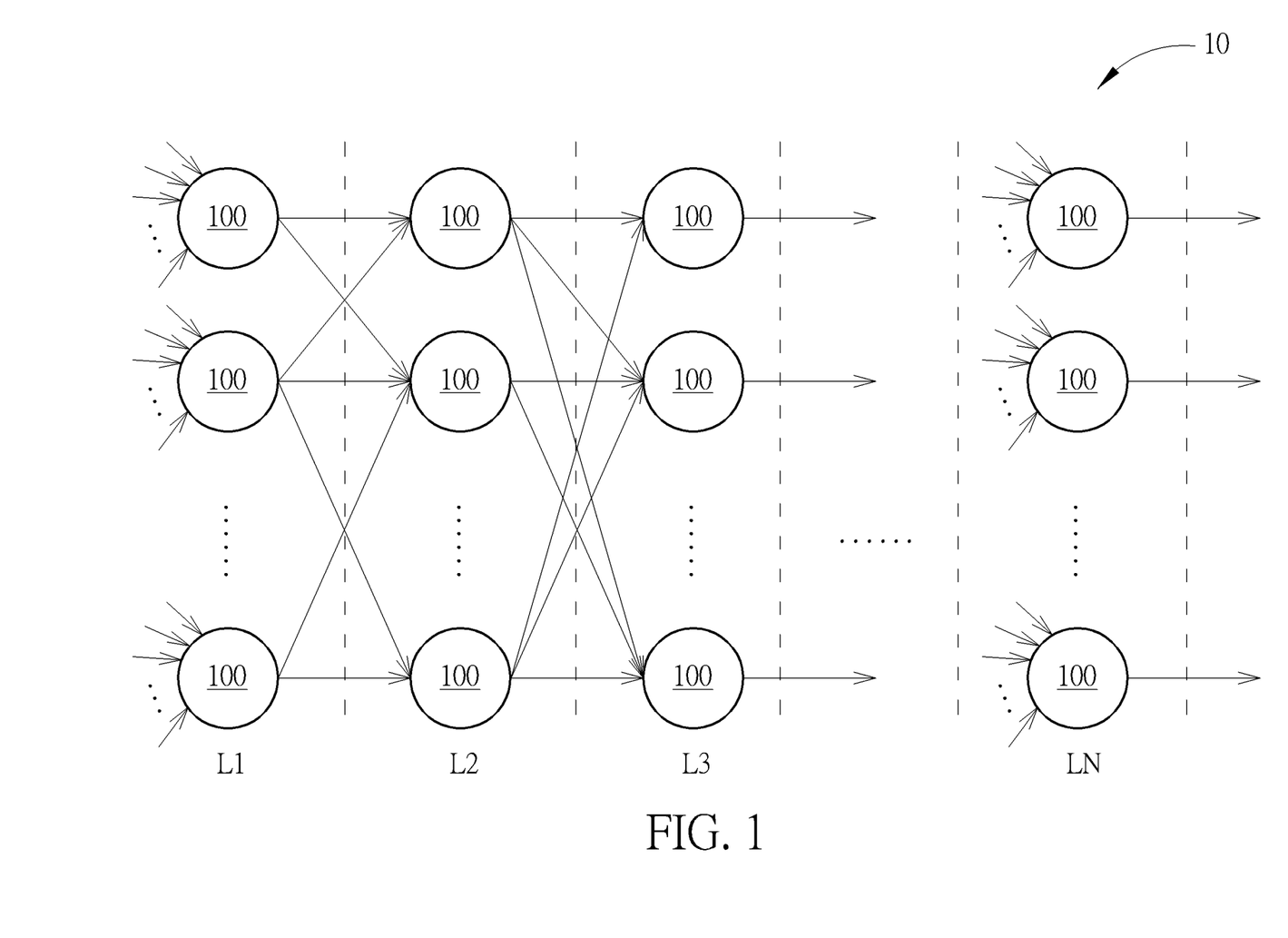
FIG. 1 shows a near-memory computation system according to one embodiment of the present invention.

FIG. 1 shows a near-memory computation system 10 according to one embodiment of the present invention. The near-memory computation system 10 can include a plurality of computation nodes 100. Each computation node 100 can receive a plurality of input signals and can output a computing result signal.

In some embodiments, the near-memory computation system 10 can be applied to the neural network for AI computing. That is, the computation nodes 100 can be connected in a hierarchy structure, and the computing result signal generated by one computation node may be used by another computation node as its input signal. For example, in FIG. 1, the computation nodes 100 can be divided into several layers L1 to LN. Computation nodes in the first layer L1 may receive the given input signals, and computation nodes in the second layer L2 will receive the computing result signals generated by the computation nodes in the first layer L1 as input signals.

Figure 2:
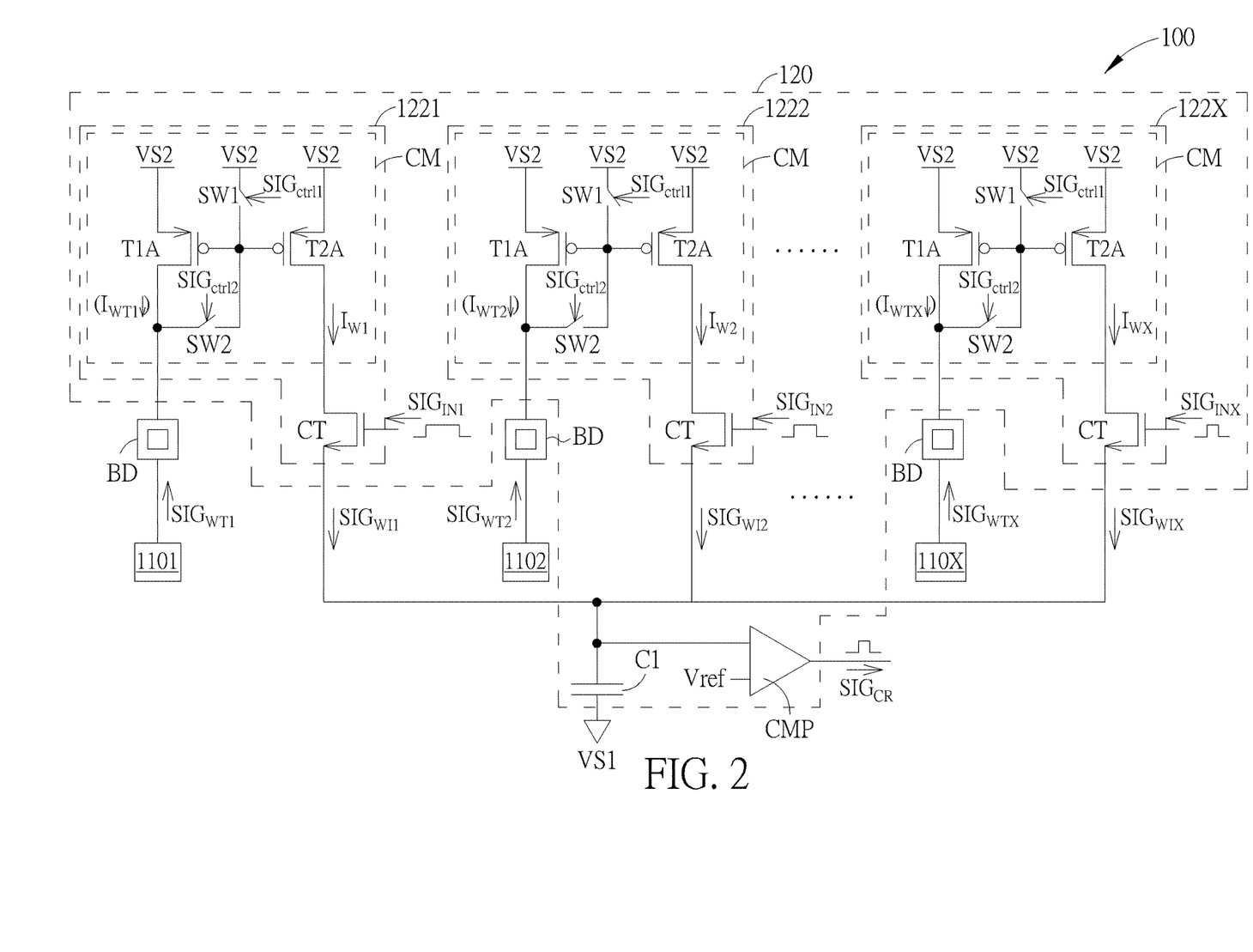
FIG. 2 shows a computation node according to one embodiment of the present invention.

FIG. 2 shows a computation node 100 according to one embodiment of the present invention. In FIG. 2, the computation node 100 includes a plurality of non-volatile memory cells 1101 to 110X and a processing element 120, where X is an integer greater than 1. In some embodiments, each of the non-volatile memory cells 1101 to 110X can store a weighting value during the program operation and can output a weighting signal according to the stored weighting value during the read operation.

The processing element 120 can receive a plurality of input signals $SIG_{IN1}$ to $SIG_{INX}$ and can generate the computing result signal $SIG_{CR}$ by performing computations with the input signals $SIG_{IN1}$ to $SIG_{INX}$ and a plurality of weighting signals $SIG_{WT1}$ to $SIG_{WTX}$ generated by the non-volatile memory cells 1101 to 110X. For example, the processor element 120 can multiply each of the input signals $SIG_{IN1}$ to $SIG_{INX}$ with a corresponding weighting signal of the weighting signals $SIG_{WT1}$ to $SIG_{WTX}$, and output the sum of the products of the input signals $SIG_{IN1}$ to $SIG_{INX}$ and weighting signals $SIG_{WT1}$ to $SIG_{WTX}$ as the computing result signal $SIG_{CR}$.

In prior art, the weighting values are stored in an external memory system, so the processing element 120 will need to retrieve the weighting values by accessing the memory system through buses. Since the AI computing usually requires huge amount of data, the regular memory accesses for huge data transmission will take a lot of time, thereby slowing down the computation. However, in the computation node 100, since the processor element 120 can be coupled to the non-volatile memory cells 1101 to 110X directly, the time required for regular memory access can be significantly reduced.

Figure 3:
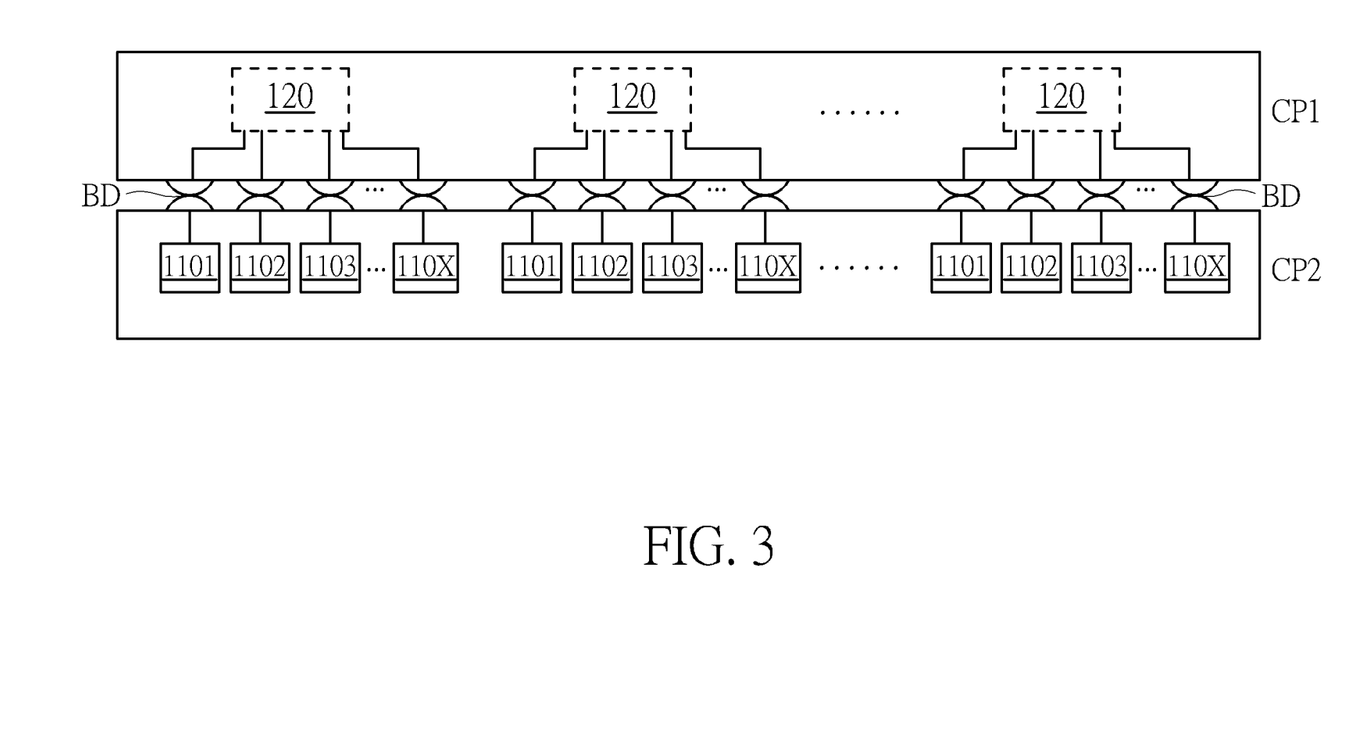
FIG. 3 shows the connection structure between the non-volatile memory cells and the processing element according to one embodiment of the present invention.

Furthermore, in some embodiments, the non-volatile memory cells 1101 to 110X and the process element 120 can be manufactured by different processes to be more cost-effective. FIG. 3 shows the connection structure between the non-volatile memory cells 1101 to 110X and the processing element 120 according to one embodiment of the present invention. In FIG. 3, the processing element 120 and the non-volatile memory cells 1101 to 110X can be disposed in two different chips CP1 and CP2. In this case, the processing element 120 can be directly coupled to the non-volatile memory cells 1101 to 110X by face-to-face bonding structures BD between the two different chips CP1 and CP2. That is, the micro bumps of the two chips CP1 and CP2 can be bonded directly.

However, in some embodiments, other techniques used for IC stack bonding can be applied. For example, the processing element 120 can also be coupled to the non-volatile memory cells 1101 to 110X by through silicon vias (TSV). Furthermore, in some other embodiments, the near-memory computation system 10 can also be formed in a system-on-a-chip (SOC), and the processing element 120 can be directly coupled to the non-volatile memory cells 1101 to 110X with on-chip interconnection.

In addition to saving the memory access time by coupling the processing element 120 to the non-volatile memory cells 1101 to 110X directly, the computation node 10 can also perform analog computations with the analog weighting signals $SIG_{WT1}$ to $SIG_{WTX}$ generated by the non-volatile memory cells 1101 to 110X to save computation efforts.

In some embodiments, the non-volatile memory cells 100 can be programmed with different program states to store different weighting values. For example, during the program operation, each of the non-volatile memory cells 1101 to 110X may be verified with a distinctive voltage/current determined according to the weighting value to be stored. In this case, during the read operation, each of the non-volatile memory cells 1101 to 110X would be able to output the weighting signal of a distinctive level of voltage or current according to the program state of the non-volatile memory cell.

For example, in FIG. 2, the weighting signals $SIG_{WT1}$ to $SIG_{WTX}$ generated by the non-volatile memory cells 1101 to 110X can be currents $I_{WT1}$ to $I_{WTX}$. In this case, if the weighting value stored by the non-volatile memory cell 1101 is greater than the weighting value stored by the non-volatile memory cell 110X, then the current $I_{WT1}$ of the weighting signal $SIG_{WT1}$ will be greater than the current $I_{WTX}$ of the weighting signal $SIG_{WTX}$.

In this case, the processing element 120 can receive the weighting signals $SIG_{WT1}$ to $SIG_{WTX}$ in forms of currents $I_{WT1}$ to $I_{WTX}$, and can perform analog computations with the weighting signals $SIG_{WT1}$ to $SIG_{WTX}$. For example, the processing element 120 can include a plurality of operation units 1221 to 122X. Each of the operation units 1221 to 122X can be coupled to a corresponding non-volatile memory cell of the non-volatile memory cells 1101 to 110X. For example, the operation unit 1221 can be coupled to the non-volatile memory cell 1101, and the operation unit 122X can be coupled to the non-volatile memory cell 110X.

In FIG. 2, each of the operation units 1221 to 122X can include a current mirror CM and a control transistor CT. The current mirror CM can be coupled to a corresponding non-volatile memory cell, and can generate a weighting current by duplicating the weighting signal generated by the corresponding non-volatile memory cell. For example, the current mirror CM of the operation unit 1221 can duplicate the weighting signal $SIG_{WT1}$, that is, the current $I_{WT1}$, generated by the non-volatile memory cell 1101 to generate the weighting current and the current mirror CM of the operation unit 122X can duplicate the weighting signal $SIG_{WTX}$, that is, the current $I_{WTX}$, generated by the non-volatile memory cell 110X to generate the weighting current $I_{WX}$.

Also, the control transistor CT has a first terminal for receiving the weighting current, a second terminal for outputting a weighted input signal, and a control terminal for receiving a corresponding input signal of the input signals $SIG_{IN1}$ to $SIG_{INX}$. In some embodiments, the duration of each of the input signals $SIG_{IN1}$ to $SIG_{INX}$ can be used to represent the input value. For example, if the input signal $SIG_{IN1}$ represents a value greater than the value represented by the input signal $SIG_{INX}$, then the duration of the input signal $SIG_{IN1}$ will be greater than the duration of the input signal $SIG_{INX}$.

In this case, during the computation, the first terminal of the control transistor CT of the operation unit 1221 will receive the weighting current $I_{W1}$ relating to the weighting signal $SIG_{WT1}$, and the control transistor CT of the operation unit 1221 will be turned on for a specific period according to the duration of the input signal $SIG_{IN1}$. Therefore, the operation unit 1221 will generate the weighted input signal $SIG_{WT1}$ according to the product of the input signal $SIG_{IN1}$ and the weighting signal $SIG_{WT1}$. Similarly, the operation unit 122X will generate the weighted input signal $SIG_{WTX}$ according to the product of the input signal $SIG_{INX}$ and the weighting signal $SIG_{WTX}$.

In FIG. 2, the processing element 120 can further include a capacitor C1 for integrating all the weighted input signals $SIG_{WT1}$ to $SIG_{WTX}$. The capacitor C1 has a first terminal coupled to second terminals of control transistors CT of the operation units 1221 to 122X, and a second terminal coupled to a first system voltage terminal VS1. In this case, during the computation, the capacitor C1 will be charged by currents of the weighted input signals $SIG_{WT1}$ to $SIG_{WTX}$, and can output the final voltage through the first terminal of the capacitor C1.

Also, the processing element 120 can further include a comparator CMP for comparing the computing result signal with a reference voltage $V_{ref}$, creating the pulse signal that can be used by the next computation node directly as an input signal. However, in some other embodiments, the processing element 120 may include some other components to generate the computing result signal $SIG_{CR}$ in the desired form according to the system requirement.

Also, in FIG. 2, the current mirrors CM can include transistors T1A and T2A, and switches SW1 and SW2. The transistor T1A has a first terminal coupled to a second system voltage terminal VS2, a second terminal coupled to the corresponding non-volatile memory cell, and a control terminal. The transistor T2A has a first terminal coupled to the second system voltage terminal VS2, a second terminal coupled to the first terminal of the control transistor CT, and a control terminal coupled to the control terminal of the transistor T1A. The switch SW1 has a first terminal coupled to the second system voltage terminal VS2, a second terminal coupled to the control terminal of the transistor T1A, and a control terminal for receiving a control signal $SIG_{ctrl1}$. The switch SW2 has a first terminal coupled to the control terminal of the transistor T1A, a second terminal coupled to the second terminal of the transistor T1A, and a control terminal for receiving a second control signal $SIG_{ctrl2}$.

In this case, while the transistors T1A and T2A can be used to duplicate the weighting signal generated by the corresponding non-volatile memory cell, the switches SW1 and SW2 can be used to control the timing of the computation for improving the accuracy.

For example, when the computation node 100 is in a standby mode, the non-volatile memory cells 1101 to 110X of the computation node 100 can be in a read state and can be ready to output the weighting signals $SIG_{WT1}$ to $SIG_{WTX}$. However, the switches SW1 of the operation units 1221 to 122X of the processing element 120 can be turned on, and the switches SW2 of the operation units 1221 to 122X of the processing element 120 can be turned off during the standby mode. Therefore, the transistors T1A and T2A will be turned off, and the current mirrors CT of the operation units 1221 to 122X will be disabled in the standby mode. Consequently, the control transistors CT of the operation units 1221 to 122X will not receive the weighting currents $I_{W1}$ to $I_{WX}$ even with the non-volatile memory cells 1101 to 110X being in the read state.

In some embodiments, before the processing element 120 adopts the input signals $SIG_{IN1}$ to $SIG_{INX}$ to start the computation, the computation node 100 may enter a setup mode, allowing the currents $I_{WT1}$ to $I_{WTX}$ of the weighting signals $SIG_{WT1}$ to $SIG_{WTX}$ to pre-charge the parasitic capacitors on the path between the non-volatile memory cells 1101 to 110X and the processing element 120.

For example, when the computation node 100 is in a setup mode, the non-volatile memory cells 1101 to 110X of the computation node 100 can be in the read state, the switches SW1 of the operation units 1221 to 122X of the processing element 120 can be turned off, and the switches SW2 of the operation units 1221 to 122X of the processing element 120 can be turned on. In this case, the current mirrors CM of the operation units 1221 to 122X of the processing element 120 are enabled, and the currents $I_{WT1}$ to $I_{WTX}$ of the weighting signals $SIG_{WT1}$ to $SIG_{WTX}$ will start to charge the parasitic capacitors along the paths from the non-volatile memory cells 1101 to 110X to the processing element 120. However, since the control transistors CT of the operation units 1221 to 122X have not received the input signal $SIG_{IN1}$ to $SIG_{INX}$ yet, the control transistors CT are remained turned off, and the computation will not be performed in the setup mode.

In some embodiments, since the non-volatile memory cells 1101 to 110X and the processing element 120 are disposed in different chips and are coupled by soldering micro bumps, the parasitic capacitors would be rather large and require more charging time. However, if the non-volatile memory cells 1101 to 110X and the processing element 120 are coupled through on-chip interconnections, then the required charging time may be shorter. That is, the duration of the standby mode can be determined according to the practical conditions.

After the standby mode, the computation node can enter the computation mode for performing the computation. When the computation node is in the computation mode, the non-volatile memory cells 1101 to 110X of the computation node 100 can be in the read state, the switches SW1 of the operation units 1221 to 122X of the processing element 120 can be turned off, and the switches SW2 of the operation units 1221 to 122X of the processing element 120 can be turned on. Also, the control terminal of each control transistor CT of the operation units 1221 to 122X of the processing element 120 will receive a corresponding input signal of the input signals $SIG_{IN1}$ to $SIG_{INX}$. Consequently, each of the control transistors CT of the operation units 1221 to 122X will be turned on for a period of time according to the input signal received, and the capacitor C1 will be charged by the weighting currents $I_{W1}$ to $I_{WX}$ generated by the current mirrors CM of the operation units 1221 to 122X.

In some embodiments, since the computing result signal generated by one computation node will be used by another computation node as the input signal later, the timing for performing computation is predictable. In this case, when the computation node is in the computation mode, the next computation node may enter the standby mode to prepare for the coming computation. For example, in FIG. 1, when the computation nodes 100 in the first layer L1 are in the computation mode, the computation nodes in the second layer L2 will enter the setup mode. Furthermore, in some embodiments, if the computation node 100 requires more time to pre-charge the parasitic capacitors, the duration of the standby mode may be longer. In this case, when the computation nodes 100 in the first layer L1 are in the computation mode, the computation nodes in the third layer L3 may also enter the setup mode, so the computation node in the third layer L3 will have more time to pre-charge the parasitic capacitors before the computation starts.

Figure 4:
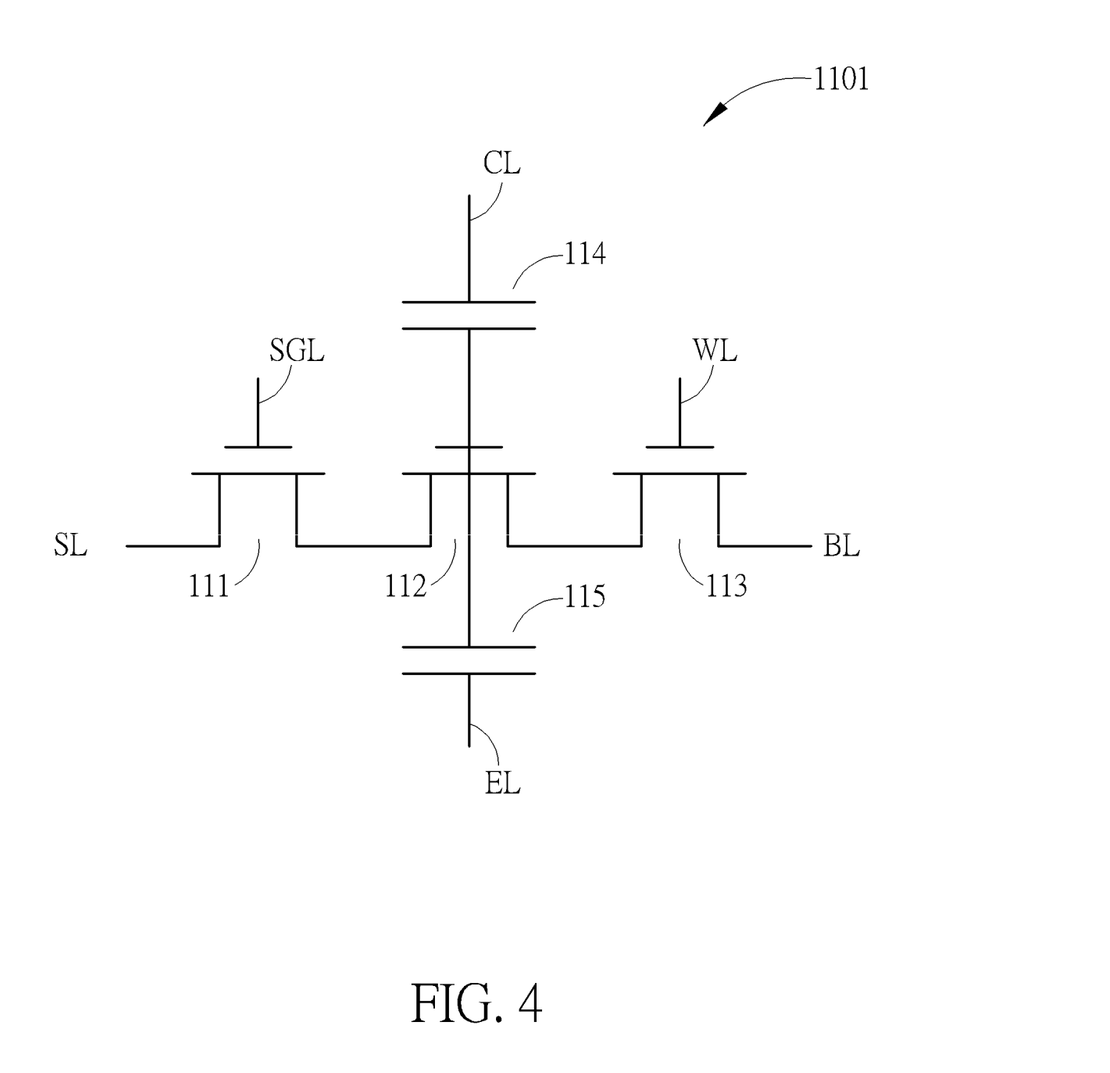
FIG. 4 shows the non-volatile memory cell according to one embodiment of the present invention.

FIG. 4 shows the non-volatile memory cell 1101 according to one embodiment of the present invention. In some embodiments, the non-volatile memory cells 1101 to 110X can all have the same structure. In FIG. 4, the non-volatile memory cell 1101 includes a first select transistor 111, a floating gate transistor 112, a second select transistor 113, a control element 114, and an erase element 115.

The first select transistor 111 has a first terminal coupled to a source line SL, a second terminal, and a control terminal coupled to a select gate line SGL. The floating gate transistor 112 has a first terminal coupled to the second terminal of the first select transistor 111, a second terminal, and a floating gate terminal. The second select transistor 113 has a first terminal coupled to the second terminal of the floating gate transistor 112, a second terminal coupled to a bit line BL, and a control terminal coupled to a word line WL.

The control element 114 has a first terminal coupled to the floating gate terminal of the floating gate transistor 112, and a second terminal coupled to a control line CL. The erase element 115 has a first terminal coupled to the floating gate terminal of the floating gate transistor 112, and a second terminal coupled to an erase line EL. In some embodiments, the control element 114 and the erase element 115 can be capacitance elements implemented by transistors. In this case, the first terminal of the control element 114, the second terminal of the erase element 115, and the floating gate terminal of the floating gate transistor 112 can be coupled through the same polysilicon layer while the second terminal of the control element 114 and the second terminal of the erase element 115 can be the source/drain terminals of the transistors.

Also, since the coupling area of the control element 114 can be rather large, the voltage of the floating gate terminal can be dominated by the control element 114. That is, the floating gate terminal can be coupled to the control line CL through the control element 114. Therefore, the control element 114 can be used during the program operation.

For example, during the program operation, the control line CL can be at a program voltage, the select gate line SGL and the word line WL can be at an operation voltage, and the bit line BL and the source line SL can be at a reference voltage. The program voltage can be greater than operation voltage, and the operation voltage can be greater than the reference voltage. In this case, the first select transistor 111 and the second select transistor 113 can be turned on, so the first terminal and the second terminal of the floating gate transistor 112 will receive the reference voltage and the floating gate terminal of the floating gate transistor 112 will be coupled to the program voltage. Therefore, the great voltage applied on the floating gate transistor 112 will induce the Fowler-Nordheim (FN) tunneling, so the electrons will be captured by the floating gate of the floating gate transistor 112, changing the program state of the non-volatile memory cell 1101.

Also, during the read operation, the source line SL, the control line CL and the erase line EL can be at the reference voltage, the select gate line SGL and the word line WL can be at the operation voltage, and the bit line BL can be pre-charged to a read voltage slightly higher than the reference voltage. In this case, the first select transistor 111 and the second select transistor 113 can be turned on, and the read current will be induced according to the program state of the non-volatile memory cell 1101.

Generally, the more electrons captured by the floating gate transistor 112, the smaller current the floating gate transistor 112 will induce during the read operation. Therefore, during the program operation, the program voltage may be applied several times according to the weighting value to be stored, and every time after the program voltage is applied, the non-volatile memory cell 1101 will be verified to check the program state until the non-volatile memory cell 1101 reaches the desired program state.

That is, if the weighting value to be stored is rather small, the program voltage may be applied to the non-volatile memory cell 1101 more times so the non-volatile memory cell 1101 will generate a smaller current during the read operation.

Furthermore, the erase element 115 with a smaller coupling area can be used to erase the non-volatile memory cell 1101. For example, during the erase operation, the first terminal and the second terminal of the floating gate transistor 112 can receive the reference voltage, and the erase line EL can be an erase voltage similar to the program voltage. In this case, the high voltage applied to the erase line EL can cause the FN tunneling again, and the electrons captured by the floating gate of the floating gate transistor 112 will be ejected through the erase element 115.

Although FIG. 4 shows an example of the non-volatile memory cell 1101 of the present invention, the non-volatile memory cells 1101 to 110X may be implemented by some other structures. For example, the non-volatile memory cells 1101 to 110X can be implemented by other multiple time programmable (MTP) memory cells or resistive random access memory (RRAM) cells in some other embodiments.

Also, the weighting signals $SIG_{WT1}$ to $SIG_{WTX}$ can be voltage signals or current signals according to the structure used by the non-volatile memory cells 1101 to 110X.

In summary, the near-memory computation system can have the processing element coupled to the memory cells directly and can receive analog signals from the memory cells for analog computations. Therefore, the efforts for accessing external memories and performing complicated computations required by AI algorithms can be significantly reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A near-memory computation system comprising:
   a plurality of computation nodes each configured to receive a plurality of input signals and output a computing result signal and comprising:
   a plurality of non-volatile memory cells each configured to store a weighting value during a program operation and output a weighting signal according to the weighting value during a read operation; and
   a processing element coupled to the plurality of non-volatile memory cells, and configured to receive the plurality of input signals and generate the computing result signal by performing computations with the plurality of input signals and a plurality of weighting signals generated by the plurality of non-volatile memory cells;
   wherein the plurality of non-volatile memory cells and the processing element are disposed in two different chips, and the processing element is directly coupled to the plurality of non-volatile memory cells by face-to-face bonding or through silicon vias (TSV) between the two different chips; and
   wherein the weighting signals generated by the plurality of non-volatile memory cells are current signals, and the processing element comprises:
   a plurality of operation units each comprising:
      a current mirror coupled to a corresponding non-volatile memory cell of the plurality of non-volatile memory cells, and configured to generate a weighting current by duplicating a weighting signal generated by the corresponding non-volatile memory cell; and
      a control transistor having a first terminal configured to receive the weighting current, a second terminal configured to output a weighted input signal, and a control terminal configured to receive a corresponding input signal of the plurality of input signals.

2. The near-memory computation system of claim 1, wherein the plurality of non-volatile memory cells and the processing element are manufactured by different processes or same processes.

3. The near-memory computation system of claim 1, wherein the near-memory computation system is formed in a system-on-a-chip, and the processing element is directly coupled to the plurality of non-volatile memory cells with on-chip interconnection.

4. The near-memory computation system of claim 1, wherein the processing element further comprises:

a capacitor having a first terminal coupled to second terminals of control transistors of the plurality of operation units, and a second terminal coupled to a first system voltage terminal.

5. The near-memory computation system of claim 1, wherein the current mirror comprises:
a first transistor having a first terminal coupled to a second system voltage terminal, a second terminal coupled to the corresponding non-volatile memory cell, and a control terminal;
a second transistor having a first terminal coupled to the second system voltage terminal, a second terminal coupled to the first terminal of the control transistor, and a control terminal coupled to the control terminal of the first transistor;
a first switch having a first terminal coupled to the second system voltage terminal, a second terminal coupled to the control terminal of the first transistor, and a control terminal configured to receive a first control signal; and
a second switch having a first terminal coupled to the control terminal of the first transistor, a second terminal coupled to the second terminal of the first transistor, and a control terminal configured to receive a second control signal.

6. The near-memory computation system of claim 5, wherein when a first computation node of the plurality of computation nodes is in a standby mode:
a plurality of non-volatile memory cells of the first computation node are in a read state;
first switches of a plurality of operation units of a processing element of the first computation node are turned on; and
second switches of the plurality of operation units of the processing element of the first computation node are turned off.

7. The near-memory computation system of claim 6, wherein when the first computation node is in a setup mode:
the plurality of non-volatile memory cells of the first computation node are in the read state;
the first switches of the plurality of operation units of the processing element of the first computation node are turned off; and
the second switches of the plurality of operation units of the processing element of the first computation node are turned on.

8. The near-memory computation system of claim 7, wherein when the first computation node is in a computation mode:
the plurality of non-volatile memory cells of the first computation node are in the read state;
the first switches of the plurality of operation units of the processing element of the first computation node are turned off;
the second switches of the plurality of operation units of the processing element of the first computation node are turned on; and
a control terminal of each control transistor of the plurality of operation units of the processing element of the first computation node receives a corresponding of the plurality of input signals.

9. The near-memory computation system of claim 8, wherein:
the plurality of computation nodes are divided into different layers;
the first computation node is in a first layer; and
when the first computation node is in the computation mode, computation nodes in a second layer and a third layer are in the setup mode.

10. A near-memory computation system comprising:
a plurality of computation nodes each configured to receive a plurality of input signals and output a computing result signal and comprising:
a plurality of non-volatile memory cells each configured to store a weighting value during a program operation and output a weighting signal according to the weighting value during a read operation; and
a processing element coupled to the plurality of non-volatile memory cells, and configured to receive the plurality of input signals and generate the computing result signal by performing computations with the plurality of input signals and a plurality of weighting signals generated by the plurality of non-volatile memory cells;
wherein the near-memory computation system is formed in a system-on-a-chip, and the processing element is directly coupled to the plurality of non-volatile memory cells with on-chip interconnection; and
wherein the weighting signals generated by the plurality of non-volatile memory cells are current signals, and the processing element comprises:
a plurality of operation units each comprising:
a current mirror coupled to a corresponding non-volatile memory cell of the plurality of non-volatile memory cells, and configured to generate a weighting current by duplicating a weighting signal generated by the corresponding non-volatile memory cell; and
a control transistor having a first terminal configured to receive the weighting current, a second terminal configured to output a weighted input signal, and a control terminal configured to receive a corresponding input signal of the plurality of input signals.

11. The near-memory computation system of claim 10, wherein the plurality of non-volatile memory cells and the processing element are manufactured by different processes or same processes.

12. The near-memory computation system of claim 10, wherein the plurality of non-volatile memory cells and the processing element are disposed in two different chips, and the processing element is directly coupled to the plurality of non-volatile memory cells by face-to-face bonding or through silicon vias (TSV) between the two different chips.

13. The near-memory computation system of claim 10, wherein the processing element further comprises:
a capacitor having a first terminal coupled to second terminals of control transistors of the plurality of operation units, and a second terminal coupled to a first system voltage terminal.

14. The near-memory computation system of claim 10, wherein the current mirror comprises:
a first transistor having a first terminal coupled to a second system voltage terminal, a second terminal coupled to the corresponding non-volatile memory cell, and a control terminal;
a second transistor having a first terminal coupled to the second system voltage terminal, a second terminal coupled to the first terminal of the control transistor, and a control terminal coupled to the control terminal of the first transistor;
a first switch having a first terminal coupled to the second system voltage terminal, a second terminal coupled to the control terminal of the first transistor, and a control terminal configured to receive a first control signal; and a second switch having a first terminal coupled to the control terminal of the first transistor, a second terminal coupled to the second terminal of the first transistor, and a control terminal configured to receive a second control signal.

15. The near-memory computation system of claim 14, wherein when a first computation node of the plurality of computation nodes is in a standby mode:

a plurality of non-volatile memory cells of the first computation node are in a read state;

first switches of a plurality of operation units of a processing element of the first computation node are turned on; and  second switches of the plurality of operation units of the processing element of the first computation node are turned off.

16. The near-memory computation system of claim 15, wherein when the first computation node is in a setup mode:

the plurality of non-volatile memory cells of the first computation node are in the read state;

the first switches of the plurality of operation units of the processing element of the first computation node are turned off; and  the second switches of the plurality of operation units of the processing element of the first computation node are turned on.

17. The near-memory computation system of claim 16, wherein when the first computation node is in a computation mode:

the plurality of non-volatile memory cells of the first computation node are in the read state;

the first switches of the plurality of operation units of the processing element of the first computation node are turned off;

the second switches of the plurality of operation units of the processing element of the first computation node are turned on; and  a control terminal of each control transistor of the plurality of operation units of the processing element of the first computation node receives a corresponding of the plurality of input signals.

18. The near-memory computation system of claim 17, wherein:

the plurality of computation nodes are divided into different layers;

the first computation node is in a first layer; and when the first computation node is in the computation mode, computation nodes in a second layer and a third layer are in the setup mode.

\* \* \* \* \*